(12) United States Patent
Biber

(10) Patent No.: US 11,269,030 B2
(45) Date of Patent: Mar. 8, 2022

(54) RECEIVING USEFUL SIGNALS IN THE MAGNETIC RESONANCE FREQUENCY BAND

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/016,632

(22) Filed: Sep. 10, 2020

(65) Prior Publication Data

US 2021/0080526 A1 Mar. 18, 2021

(30) Foreign Application Priority Data

Sep. 17, 2019 (EP) ..................................... 19197748

(51) Int. Cl.
*G01R 33/36* (2006.01)
*G01R 33/56* (2006.01)

(52) U.S. Cl.
CPC ..... *G01R 33/3607* (2013.01); *G01R 33/3642* (2013.01); *G01R 33/5608* (2013.01)

(58) Field of Classification Search
USPC ........................................................ 324/309
See application file for complete search history.

(56) References Cited

U.S. PATENT DOCUMENTS

| | | | |
|---|---|---|---|
| 7,747,304 B2* | 6/2010 | Gleich | A61K 49/001 600/407 |
| 10,663,543 B2* | 5/2020 | Biber | G01R 33/3692 |
| 2003/0085703 A1* | 5/2003 | Gleich | A61B 5/05 324/309 |
| 2006/0244452 A1 | 11/2006 | Den Boef | |
| 2009/0302845 A1 | 12/2009 | Biber | |
| 2013/0342199 A1 | 12/2013 | Bollenbeck et al. | |
| 2014/0070807 A1 | 3/2014 | Biber | |

(Continued)

FOREIGN PATENT DOCUMENTS

| DE | 102012216292 A1 | 5/2014 |
|---|---|---|
| EP | 3650878 A1 | 5/2020 |

OTHER PUBLICATIONS

Google Translation of European Search Report for related European Patent Application No. 19197748, dated Mar. 26, 2020. (Year: 2020).*

(Continued)

*Primary Examiner* — Rodneye Fuller
(74) *Attorney, Agent, or Firm* — Lempia Summerfield Katz LLC

(57) ABSTRACT

A method for determining an item of evaluation information from a reception signal received by a magnetic resonance apparatus, a computer program product for carrying out such a method, and a magnetic resonance apparatus generate a useful signal having a first frequency band. The magnetic resonance apparatus is configured to generate a magnetic resonance signal in a second frequency band. The first frequency band lies at least partially, (e.g., completely), within the second frequency band. A reception signal is received by a receiving unit of the magnetic resonance apparatus. From the reception signal, an item of evaluation information is determined which characterizes the useful signal.

17 Claims, 4 Drawing Sheets

10 Magnetic resonance apparatus
11 Magnet unit
12 Main magnet
13 RF transmitter
14 Patient receiving region
15 Patient
16 Patient positioning apparatus
17 Patient table
18 Gradient coil unit
19 Gradient control unit
20 RF transmitting coil
21 RF control unit
22 System control unit
23 User interface
24 Display unit
25 Input unit
26 Evaluating unit
27 Local coil
$A_1, A_2, A_3$ Coil elements

(56) References Cited

U.S. PATENT DOCUMENTS

2017/0160364 A1* 6/2017 Fenchel ........... G01R 33/56308
2018/0045801 A1   2/2018 Speier et al.
2020/0249292 A1   8/2020 Biber et al.

OTHER PUBLICATIONS

Speier, P. et al., "PT-Nav: A Novel Respiratory Navigation Method for Continuous Acquisition Based on Modulation of a Pilot Tone in the MR-Receiver," ESMRMB 129: pp. 97-98, 2015.

Schroeder, Lea et al. "A Novel Method for Contact-Free Cardiac Synchronization Using the Pilot Tone Navigator" Proceedings of the 24th Annual Meeting of the ISMRM, Abstract 0410, ISMRM 2016.

Schroeder, Lea et al. "Two-Dimensional Respiratory-Motion Characterization for Continuous MR Measurements Using Pilot Tone Navigation" Proceedings of the 24th Annual Meeting of the ISMRM, Abstract 3103, ISMRM 2016.

European Search Report for related European Patent Application No. 19197748, dated Mar. 26, 2020.

* cited by examiner

10  Magnetic resonance apparatus
11  Magnet unit
12  Main magnet
13  RF transmitter
14  Patient receiving region
15  Patient
16  Patient positioning apparatus
17  Patient table
18  Gradient coil unit
19  Gradient control unit
20  RF transmitting coil
21  RF control unit
22  System control unit
23  User interface
24  Display unit
25  Input unit
26  Evaluating unit
27  Local coil
$A_1, A_2, A_3$  Coil elements

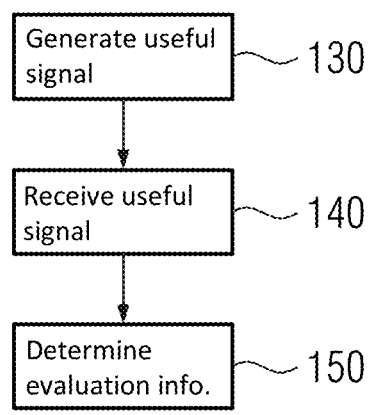
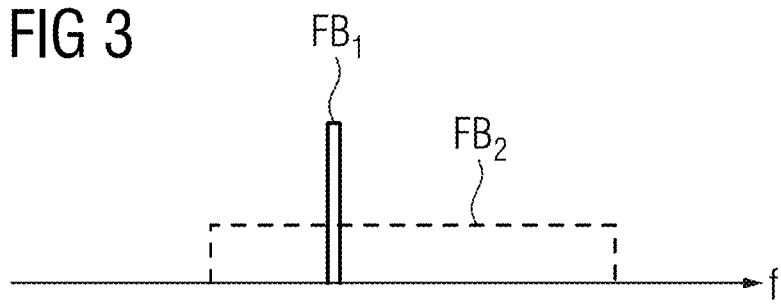

| 13 RF transmitter | A1, A2, A3 | Coil elements |
| 15 Patient | C | Part of the useful signal |
| 20 RF transmitting coil | E | Control signal |
| 21 RF control unit | Sk1, Sk2, Sk3 | Corrected reception signal portions |
| 22 System control unit | Wk1, Wk2, Wk3 | Weighting factors |
| 26 Evaluating unit | Wkn(t) | Temporal sequence |
| | W1, W2, W3 | Coil sensitivities |
| | Σ | Image data set |

RECEIVING USEFUL SIGNALS IN THE MAGNETIC RESONANCE FREQUENCY BAND

The present patent document claims the benefit of European Patent Application No. 19197748.7, filed Sep. 17, 2019, which is hereby incorporated by reference.

TECHNICAL FIELD

The disclosure relates to a method for determining an item of evaluation information from a reception signal received by a magnetic resonance apparatus, a computer program product for carrying out such a method, and a magnetic resonance apparatus.

BACKGROUND

Magnetic resonance tomography (MRT) or magnetic resonance imaging (MRI) is a known technology for generating images of an interior of the body of a patient, that is, magnetic resonance images. For this purpose, in a magnetic resonance apparatus, rapidly switched gradient pulses generated by a gradient system of the magnetic resonance apparatus may be overlaid onto a static constant magnetic field. Furthermore, radio frequency magnetic resonance excitation signals are radiated into the patient by a radio frequency (RF) transmitting coil of the magnetic resonance apparatus to elicit magnetic resonance signals and the magnetic resonance signals caused are recorded.

Apart from the magnetic resonance signals, evaluation information may be useful. Such evaluation information is, for example, information on the basis of which a correction of a movement of the patient may be undertaken, e.g., breathing, heartbeat, or movement of the head, the extremities, and the abdomen during the recording of the magnetic resonance signals. A further example of evaluation information is signals on the basis of which a receiver chain of the magnetic resonance apparatus may be calibrated and/or monitored. This enables, for example, a higher degree of stability during a scan or an easier search for any errors during a servicing of the magnetic resonance apparatus.

SUMMARY AND DESCRIPTION

An object of the present disclosure may be considered to be providing an efficient method for determining evaluation information.

The scope of the present disclosure is defined solely by the appended claims and is not affected to any degree by the statements within this summary. The present embodiments may obviate one or more of the drawbacks or limitations in the related art.

Thus, a method is proposed for determining an item of evaluation information from a reception signal received by a magnetic resonance apparatus. Therein, a useful signal is generated that has a first frequency band. The magnetic resonance apparatus is configured to generate a magnetic resonance signal in a second frequency band, in particular, by the excitation of protons. The first frequency band lies at least partially, (e.g., completely), within the second frequency band, e.g., the useful signal and any magnetic resonance signal are not spectrally separated. A reception signal is received by a receiving unit of the magnetic resonance apparatus. From the reception signal, an item of evaluation information is determined which characterizes the useful signal. The determination of the evaluation information may take place by an evaluating unit which may include a computer unit and/or a storage unit. The computer unit may include one or more processors.

Advantageously, the method disclosed enables the simultaneous use of the magnetic resonance frequency band, that is, the second frequency band, for the reception of magnetic resonance signals and useful signals. The useful signal is a signal different from a magnetic resonance signal, e.g., it is not generated with the aid of the physical phenomenon of magnetic resonance. Advantageously, the reception signal includes both any magnetic resonance signal and also the useful signal. In that the useful signal lies in the same frequency band as possible magnetic resonance signals, the useful signals may also be acquired without additional apparatus, because the receiving unit is, in any event, configured to be able to receive magnetic resonance signals. Difficulties arising during a possible spectral separation of the signals, (e.g., with necessary additional filters), therefore do not occur.

By the determination of the evaluation information, in particular, the information of the reception signal may be separated again. In particular, the evaluation information characterizing the useful signal may be the useful signal itself. The evaluation information may also be used to improve the operation and/or the maintenance of the magnetic resonance apparatus.

A frequency band of a signal may be understood to be, in particular, regions of the frequency spectrum of the signal, (e.g., of a time signal). For example, a frequency spectrum of a time signal may be determined by a Fourier transform of the time signal. A frequency spectrum of a time signal may be described by the 6 dB fall in the Fourier transform of the time signal.

The second frequency band may include the Larmor frequency $f_{Larmor}$, e.g., the frequency of the Larmor precession of the atoms at which an excitation by the magnetic resonance excitation signal takes place.

The Larmor frequency $f_{Larmor}$ may be calculated from:

$$f_{Larmor} = \frac{\gamma}{2\pi} \cdot |B|$$

Thereby $\gamma$ is the gyromagnetic ratio which is dependent upon the particle to be excited. Mostly protons are excited during a magnetic resonance examination. For this, $\gamma_P$=2,675·10$^8$s$^{-1}$T$^{-1}$ applies. B is the strength of the magnetic field which, in magnetic resonance examinations, may be in a range of 0.1 and 10 T, (e.g., 1.5 T, 3 T, or 7 T).

The second frequency band may include the frequency range $f_{Larmor}$±W, wherein W may be in a range of 50 and 1000 kHz, e.g., 250 kHz.

A receiving unit may include one or more receiving coils, e.g. local coils, to which one or more amplifiers are connected for amplifying the reception signal. The receiving unit may have a receiving frequency band which includes the first and second frequency band.

A further embodiment of the method provides that in the second frequency band, a magnetic resonance signal is generated wherein the reception signal has an overlaying of the magnetic resonance signal with the useful signal.

The useful signal and the magnetic resonance signal may be situated in the same temporal and spectral region. The magnetic resonance signal and the useful signal may overlap completely, temporally, and spectrally. Thus, a simultaneous reception of magnetic resonance signals and useful signals is enabled.

In particular, the magnetic resonance signal and/or the useful signal may be extracted from the reception signal. Based on the evaluation information, the magnetic resonance signal may be reconstructed from the reception signal. For this purpose, the reception signal may be cleaned of the useful signal. At least one magnetic resonance image may be calculated from the reconstructed magnetic resonance signal. Such a magnetic resonance image may be displayed, for example, on a monitor and/or stored on a data carrier.

The creation of the magnetic resonance signals may include a creation of a magnetic resonance excitation signal, a radiation of the magnetic resonance excitation signal into a patient, an excitation of an atom of the patient by the interaction of the magnetic resonance excitation signal with the atomic nucleus and an emission of the magnetic resonance signal from the atomic nucleus of the patient.

The generation of the magnetic resonance excitation signal may take place, in particular, with an RF transmitting coil, e.g., a body coil.

The creation of the useful signal may include a creation of a useful excitation signal and a changing of the useful excitation signal into the useful signal by interaction with an examination object.

By the interaction of the useful excitation signal with the examination object, the bandwidth of the signal may be only slightly changed, so that the useful excitation signal is also substantially situated in the first frequency band. Due to the interaction of the useful excitation signal with the examination object, only the amplitude and/or the phase of the signal may be changed, but not its bandwidth.

The useful excitation signal may possibly also be formed substantially single-frequency, so that the first frequency band may be defined with one frequency line.

The useful excitation signal may be generated by an RF transmitter. For example, the RF transmitter may be an apparatus different from the RF transmitting coil. Thereafter, the useful excitation signal is influenced by interaction with the examination object, so that the useful signal proceeds from the useful excitation signal. Advantageously, the interaction with the examination object is impressed upon the useful signal, so that information concerning the examination object, in particular, the evaluation information characterizing the useful signal, may be derived from the useful signal.

A further embodiment of the proposed method provides that the examination object is a patient. For example, based on the evaluation information, a movement of the patient may be determined.

A further embodiment of the proposed method provides that the examination object is a receiver chain of the magnetic resonance apparatus, whereby, based on the evaluation information, a property of the receiver chain is determined. The receiver chain may include the receiving unit. It may also include further components, for example, signal amplifiers, signal converters, etc.

The determination of the property of the receiver chain may enable a calibration of the receiver chain during a scan in order, in particular, to increase the measuring stability (e.g., on a drift of the receiver electronics due to temperature effects). Furthermore, the determination of the property of the receiver chain may enable a monitoring of the receiver chain for servicing purposes and/or for delimiting the source of errors in the receiver chain.

In order to determine the evaluation information, the useful excitation signal may be used. Using the useful excitation signal, in particular, a comparison and/or a correlation with the useful signal may be carried out. Advantageously, by this process, the interaction of the useful excitation signal with an examination object may be determined more exactly and the evaluation information may be improved.

The useful excitation signal may be known exactly in amplitude and phase. This may be achieved in that an, in particular, digital activating signal is known exactly and an, in particular, analogue RF transmitter of the useful excitation signal activated by the activating signal is very precisely calibrated. The activating signal may be generated, for example, by the evaluating unit and/or fed to it.

Alternatively, or additionally, a portion of the useful excitation signal may be decoupled by a coupler. This portion of the useful excitation signal may be fed to the evaluating unit.

A further embodiment of the method provides that the receiving unit includes a plurality of receiving channels, wherein for each receiving channel, a weighting factor is determined as evaluation information.

The weighting factors may be determined by an iterative minimization of a correlation between the useful excitation signal and the reception signal. For example, the useful excitation signal is subtracted from the reception signal with a preliminary weighting factor, and from this, a modified receiving signal results. A remaining correlation between the modified reception signal and the useful excitation signal is determined. The preliminary weighting factor may be optimized for as long the remaining correlation between the modified reception signal and the useful excitation signal falls below a pre-determined threshold value or becomes zero. The preliminary weighting factor resulting therefrom is used as the weighting factor.

The weighting factors may be determined by reconstruction of the magnetic resonance signal from the reception signal. In particular, the weighting factors are thereby determined such that the useful signal in a modified reception signal is minimized so that the modified reception signal corresponds as exactly as possible to the magnetic resonance signal. Magnetic resonance images of the patient may thus be calculated from the modified reception signal.

In particular, the receiving unit may include a plurality of coil elements, e.g., receiving antennae which are each associated with one of the plurality of receiving channels. The coil elements may be arranged in one or more local coils and/or in firmly installed coils, for example, a body coil.

An embodiment of the method provides that the reception signal includes a plurality of reception signal portions, each of which is received by a receiving channel, wherein for the reconstruction of the magnetic resonance signal for each receiving channel, the useful excitation signal is subtracted from the respective reception signal portion weighted with the respectively determined weighting factor.

In other words, each coil element may receive a reception signal portion of the reception signal. A weighting factor may state with what relative weighting the useful excitation signal is subtracted from the respective reception signal in order to reconstruct the magnetic resonance signal from the reception signal.

The evaluation information, (e.g., the weighting factors), may be further processed in order thereby, for example, to detect a patient movement and/or to determine a property of the receiver chain. For example, an altered coupling between the useful excitation signal and the coil element due to a patient movement has its effect on the weighting factor, which is associated with the coil element. The weighting factor may thereby be represented, in particular, as a complex-valued number which may be used directly to observe a patient movement.

A possible further processing of the weighting factors includes, for example, a determination of a temporal change of the at least one weighting factor and/or a comparison of the at least one weighting factor with at least one pre-determined reference value and/or a comparison of the at least one weighting factor of a receiving channel with at least one weighting factor of another receiving channel.

Furthermore, a magnetic resonance apparatus is proposed which is configured to carry out a method as described above for determining an item of evaluation information from a reception signal received by the magnetic resonance apparatus.

The magnetic resonance apparatus may include an RF-transmitting coil for generating a magnetic resonance excitation signal, an RF transmitter for generating a useful excitation signal, and an evaluating unit for determining an item of evaluation information.

The advantages of the magnetic resonance apparatus substantially correspond to the advantages of the described embodiments of the proposed method for determining an item of evaluation information from a reception signal received by the magnetic resonance apparatus, as described in detail above. Features, advantages, or alternative embodiments mentioned herein may also be transferred to the other claimed subject matter and vice versa.

Furthermore, a computer program product is proposed which includes a program and is directly loadable into a memory store of a programmable system control unit of a magnetic resonance apparatus, and has program devices or modules, for example, libraries and auxiliary functions in order to carry out a method as described above when the computer program product is executed in the system control unit of the magnetic resonance apparatus. The computer program product may herein include an item of software with a source code which is compiled and linked or which is only interpreted, or an executable software code which, for execution, is only loaded into the system control unit. By the computer program product, the method may be carried out rapidly, exactly reproducibly, and robustly. The computer program product is configured such that it may carry out the method acts by the system control unit. The system control unit has the respective pre-conditions such as, for example, a corresponding working memory store, a corresponding graphics card, or a corresponding logic unit so that the respective method acts may be carried out efficiently. The computer program product is stored, for example, on a computer-readable medium or is deposited on a network or server from where it may be loaded into the processor of a local system control unit which may be directly connected to the magnetic resonance apparatus or may be configured as part of the magnetic resonance apparatus. Furthermore, control information of the computer program product may be stored on an electronically readable data carrier. The items of control information of the electronically readable data carrier may be configured such that they carry out a method as described above when the data carrier is used in a system control unit of a magnetic resonance apparatus. Examples of electronically readable data carriers are a DVD, a magnetic tape, or a USB stick, on which electronically readable control information, in particular software, is stored. If this control information is read from the data carrier and stored in a system control unit of the magnetic resonance apparatus, all the embodiments of the above-described methods may be carried out. The disclosure may therefore also proceed from the aforementioned computer-readable medium and/or the aforementioned electronically readable data carrier.

BRIEF DESCRIPTION OF THE DRAWINGS

Further advantages, features, and details of the disclosure are disclosed in the exemplary embodiments described below and the drawings. Parts which correspond to one another are provided with the same reference signs in all the drawings.

In the drawings:

FIG. 2 is an exemplary method shown as a flow diagram.

FIG. 3 is an example of a frequency graph with the frequency bands of a magnetic resonance signal and of a useful signal.

DETAILED DESCRIPTION

Figure 1:
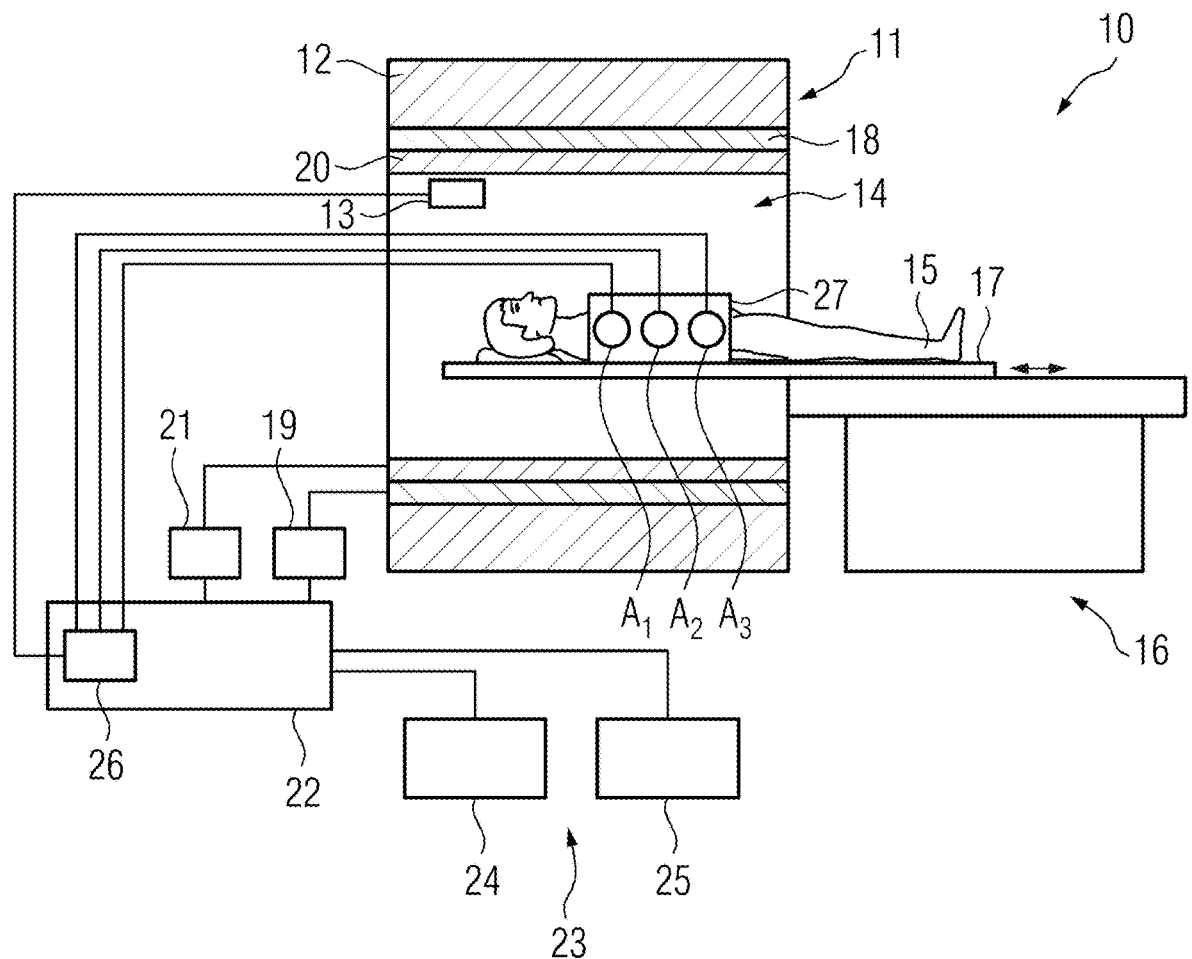
FIG. 1 is a schematic representation of an example of a magnetic resonance apparatus.

FIG. 1 shows schematically a magnetic resonance apparatus 10. The magnetic resonance apparatus 10 includes a magnet unit 11 which has a main magnet 12 for generating a strong and, particularly, temporally constant main magnetic field. In addition, the magnetic resonance apparatus 10 includes a patient receiving region 14 to accommodate a patient 15. In the present exemplary embodiment, the patient receiving region 14 is configured cylindrical and is surrounded cylindrically in a peripheral direction by the magnet unit 11. In principle, however, an embodiment of the patient receiving region 14 deviating therefrom is readily conceivable. The patient 15 may be pushed by a patient positioning apparatus 16 of the magnetic resonance apparatus 10 into the patient receiving region 14. For this purpose, the patient positioning apparatus 16 has a patient table 17 configured to be movable within the patient receiving region 14.

The magnet unit 11 also has a gradient coil unit 18 for generating magnetic field gradients that are used for position encoding during an imaging process. The gradient coil unit 18 is controlled by a gradient control unit 19 of the magnetic resonance apparatus 10. The magnetic resonance apparatus 10 further includes an RF transmitting coil 20 configured in the present exemplary embodiment as a body coil which is firmly integrated into the magnetic resonance apparatus 10. The radio frequency transmitting coil 20 is configured for an excitation of atomic nuclei, which arises in the main magnetic field generated by the main magnet 12. The radio frequency antenna unit 20 is controlled by an RF control unit 21 of the magnetic resonance apparatus 10 and radiates radio frequency magnetic resonance sequences into an examination space which is substantially formed by a patient receiving region 14 of the magnetic resonance apparatus 10. The RF transmitting coil 20 is also configured for the reception of magnetic resonance signals.

For control of the main magnet 12, the gradient control unit 19 and, for control of the RF control unit 21, the magnetic resonance apparatus 10 has a system control unit 22. The system control unit 22 centrally controls the magnetic resonance apparatus 10, for example, the execution of a pre-determined imaging gradient echo sequence. Furthermore, the system control unit 22 includes an image reconstruction unit (not disclosed in detail) for calculating magnetic resonance images from magnetic resonance signals acquired during the magnetic resonance examination. Furthermore, the magnetic resonance apparatus 10 includes a user interface 23 which is connected to the system control unit 22. Control information such as, for example, imaging parameters and calculated magnetic resonance images may be displayed on a display unit 24, for example, on at least one monitor, of the user interface 23 for medical operating personnel. In addition, the user interface 23 has an input unit 25 by which information and/or parameters may be input by the operating medical personnel during a scanning procedure.

In addition, the magnetic resonance unit has a local coil 27 which is arranged on the patient 15. In this example, for reasons of clear representation, the local coil 27 is shown with only three coil elements $A_1, A_2, A_3$. The number of coil elements may also, however, be larger or smaller. Each of these coil elements $A_1, A_2, A_3$ is designed for the reception of RF signals within the frequency band of magnetic resonance signals.

The coil elements $A_1, A_2, A_3$ are each part of a receiving channel, e.g., 3 receiving channels are represented here. By the receiving channels, the signals received by the coil elements $A_1, A_2, A_3$ are transferred to an evaluating unit 26.

Furthermore, the magnetic resonance apparatus includes an RF transmitter 13 configured to emit a useful excitation signal. The useful excitation signal may enter into interaction with an examination object, for example, the patient 15. By the interaction, the useful excitation signal may change into a useful signal. The frequency portions of the useful signal lie at least partially within the frequency band of the magnetic resonance signals and may thus also be received by the coil elements $A_1, A_2, A_3$ of the local coil 27.

It is conceivable that the magnetic resonance apparatus 10, (e.g., the RF transmitter 13), has a coupler (not shown here) configured to feed a portion of the useful excitation signal to the evaluating unit 26.

In FIG. 2, a method for determining an item of evaluation information from a reception signal received by the magnetic resonance apparatus 10 is shown. The magnetic resonance apparatus 10 is herein configured to generate a magnetic resonance signal in a second frequency band. In act 130, a useful signal is generated in a first frequency band, wherein the first frequency band lies at least partially, (e.g., completely), within the second frequency band. In act 140, the useful signal is received or recorded by a receiving unit of the magnetic resonance apparatus 10. The receiving unit may include coil elements $A_1, A_2, A_3$. In act 150, an item of evaluation information characterizing a useful signal is determined from the reception signal.

In FIG. 3, for example, a first frequency band $FB_1$ of the useful signal and a second frequency band $FB_2$ of the magnetic resonance signal is shown. Entered on the horizontal axis of the graph is the frequency f. Herein, the first frequency band $FB_1$ is situated completely within the second frequency band $FB_2$. Thus, the receiving unit, which naturally is configured to cover the first frequency band $FB_2$ in order to be able to receive magnetic resonance signals is also capable of receiving signals in the second frequency band. Thereby, useful signals may be sent along as well on the second frequency band $FB_2$, the magnetic resonance frequency band. An additional, separate receiving unit is thus not necessary.

Figure 4:
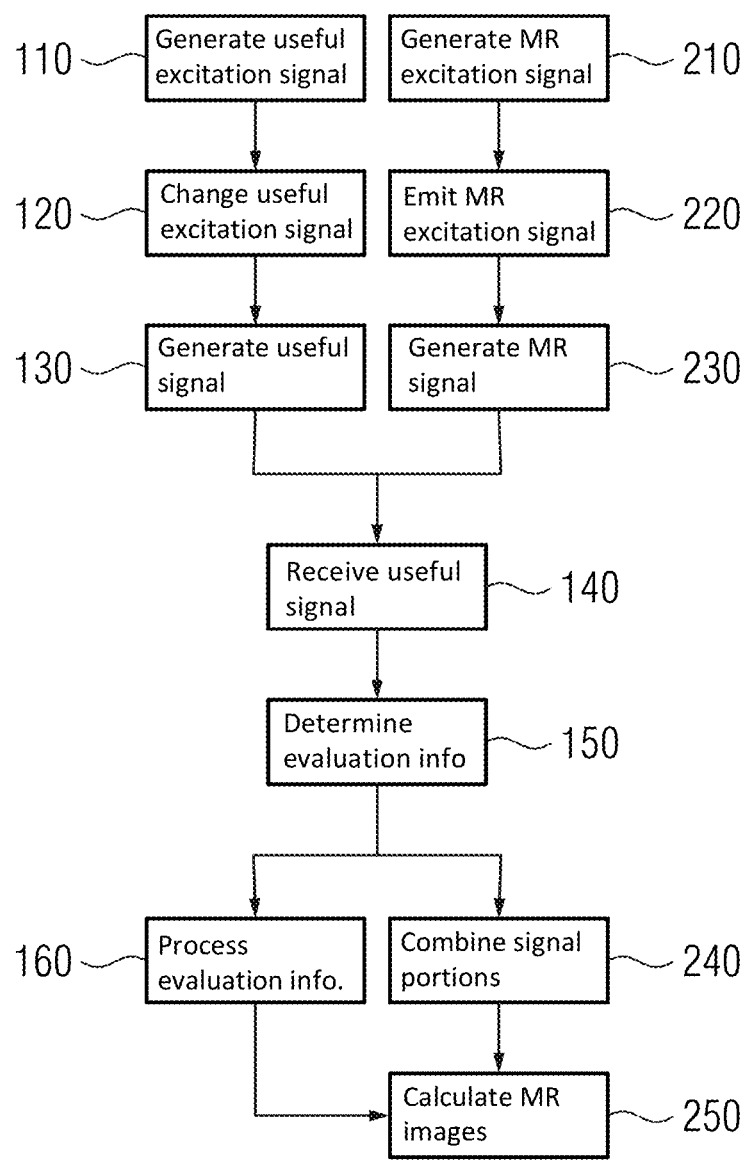
FIG. 4 is an extended exemplary method shown as a flow diagram.

In FIG. 4, an extended method for determining an item of evaluation information from a reception signal received by the magnetic resonance apparatus 10 is shown. Herein, a useful excitation signal is generated in act 110. By an interaction with an examination object, for example, a patient 15 or a receiver chain, in act 120, the useful excitation signal is changed into the useful signal so that in act 130, the useful signal is generated. There follow the acts 140 and 150 already disclosed in FIG. 2. In act 160, the evaluation information determined in act 150 is further processed. If, for example, in act 120 an interaction with a receiver chain takes place, in act 160, a property of the receiver chain may be determined. This may be advantageous, for example, during a monitoring of a receiving unit for service purposes and/or for delimiting an error cause in the receiver chain.

The method may also include further acts. Thus, in act 210, a magnetic resonance excitation signal may be generated, the frequency portions of which lie within the second frequency band $FB_2$. By an interaction with the patient 15 in act 220, magnetic resonance signals may be generated in act 230. The useful signal generated in act 130 and the magnetic resonance signal generated in act 230 may become overlaid to a reception signal and be received in act 140. In act 150, an item of evaluation information characterizing a useful signal is determined from the reception signal. Associated therewith, in act 240, the magnetic resonance signal is reconstructed. Finally in act 250, one or more magnetic resonance images are calculated from the magnetic resonance signal. Evaluation information from act 160 may also be included in this calculation. If, for example, in act 120, an interaction with a patient 15 has taken place, then, in act 160, a movement of the patient may be determined. This information may be considered in the context of a movement correction in the calculation of the magnetic resonance images in act 250.

Figure 5:
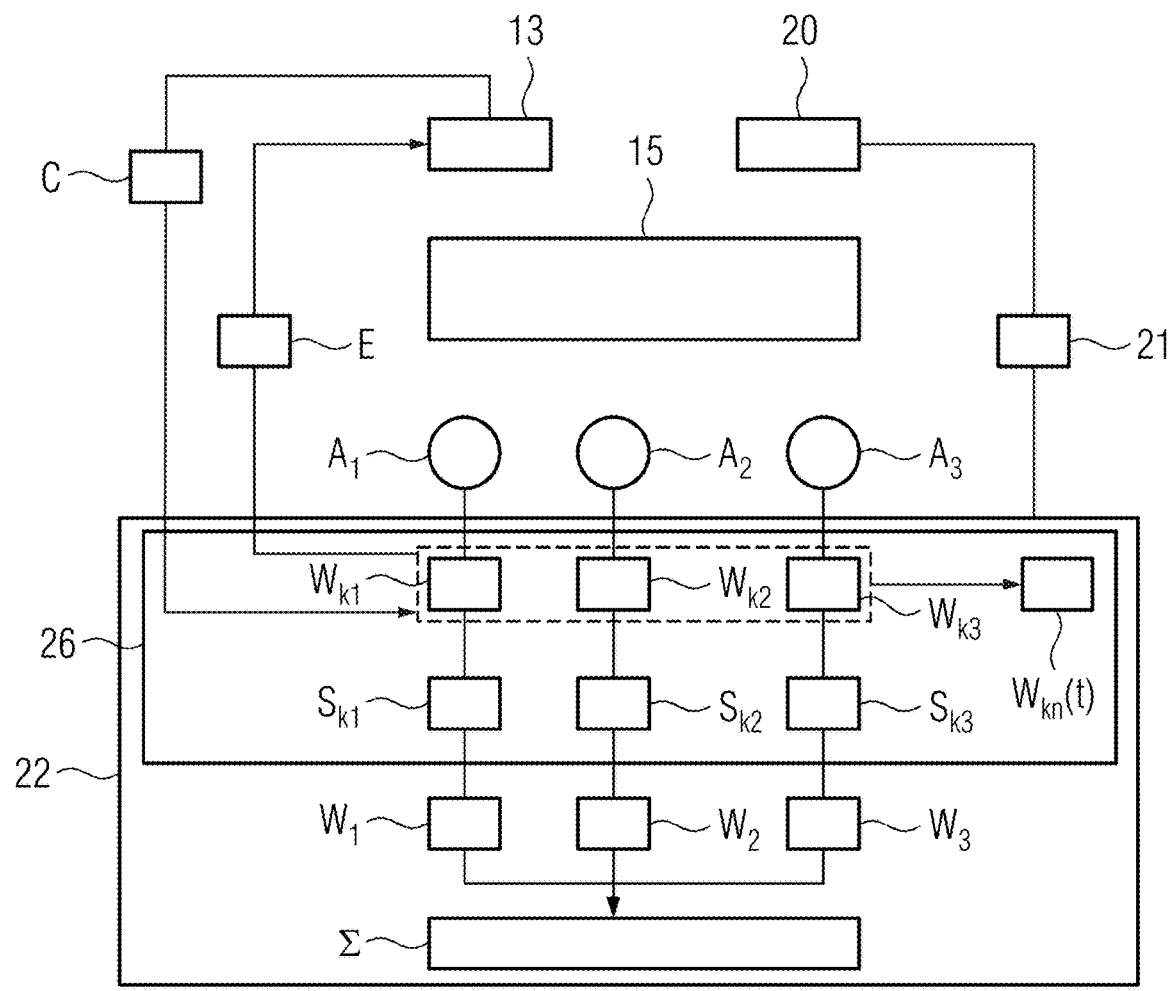
FIG. 5 is a schematic representation of an example of a signal processing.

Possible aspects of the proposed method are now to be described in detail making reference to FIG. 5 together with FIGS. 3 and 4.

A, particularly digital, control signal E is emitted to the RF transmitter 13, whereupon the RF transmitter 13 emits in act 110, a useful excitation signal within the bandwidth of the magnetic resonance experiment $FB_2$. By an interaction with the patient 15 in act 130, the useful excitation signal is converted in act 120 into a useful signal. Useful excitation signals and the useful signal arising therefrom may differ insignificantly in their frequency spectrum, so that the useful excitation signal lies in the first frequency band $FB_1$.

In act 140, the useful signal is recorded by the coil elements $A_1, A_2, A_3$ and the receiving components lying behind them, each of which, together with the respective coil element, forms a receiving channel. This may take place temporally together with the recording of magnetic resonance signals or separately from them.

In the case that magnetic resonance signals are recorded simultaneously, in act 210 the RF transmitting coil 20, controlled by the RF control unit, emits magnetic resonance excitation signals which interact in act 220 with the patient, so that in act 230, magnetic resonance signals are generated. The magnetic resonance signals would then be received in act 140, overlaid with the useful signal as a reception signal by the coil elements $A_1, A_2, A_3$. Each coil element $A_1, A_2, A_3$ thereby receives a reception signal portion of the reception signal.

The useful excitation signal is known, (e.g., exactly), in amplitude and phase. This is provided, for example, in that the control signal E is known exactly and the RF transmitter 13 is very precisely calibrated. A further possibility lies therein that a coupler (not shown here) decouples a small part C of the useful excitation signal and feeds it to the evaluating unit 26. As a result, the useful excitation signal may be used for determining the weighting factor $w_{kn}$.

A subsequent signal processing in act 150 subtracts the useful signal from each individual receiving channel. Before the subtraction, the weighting factors $w_{kn}$ (n=1, 2 or 3), with which the useful signal is extracted from the respective reception signal portion, are determined. The weighting factors $w_{kn}$ are therein determined such that the useful signal is minimized following the subtraction into corrected reception signal portions $S_{kn}$ (n=1, 2 or 3). An elimination of such "disturbance signals" by suitable subtraction may be carried out, for example, with a sidelobe canceler method. Disturbance suppression of more than 60 dB may be achieved thereby. In the event of a simultaneous reception of magnetic resonance signals, therefore, on the basis of the weighting factors $w_{kn}$, the magnetic resonance signal is reconstructed from the reception signal.

The corrected reception signal portions $S_{kn}$ may be combined in act 240, weighted in a known manner with coil sensitivities $w_n$ (n=1, 2 or 3), to an image data set $\Sigma$. Therefrom, in act 250, one or more magnetic resonance images are calculated.

Rather than evaluating the levels (amplitude and phase) of the useful signal itself, in act 160 in particular, the weighting factors $w_{kn}$ may be used as evaluation information. The weighting factors $w_{kn}$ may be used, in particular, to determine a movement of the patient 15 or a property of the receiver chain. For this purpose, for example, the temporal sequence $w_{kn}(t)$ may be determined. Furthermore, the weighting factors $w_{kn}$, may be compared with previously known values or with values of adjacent coil elements. For example, an altered coupling between the useful signal and the coil element may affect the weighting factor accordingly, on the basis of the patient movement, and this complex-valued number may be used directly to observe patient movement.

Finally, it should again be noted that the method described above in detail and the magnetic resonance apparatus disclosed are merely exemplary embodiments which may be modified by a person skilled in the art in a broad variety of ways without departing from the scope of the disclosure. Further, the use of the indefinite article "a" or "an" does not preclude the possibility that the relevant features are also present plurally. Similarly, the expression "unit" does not preclude the relevant components consisting of a plurality of cooperating subcomponents which may also be spatially distributed if necessary.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining an item of evaluation information from a reception signal received by a magnetic resonance apparatus, the method comprising:
generating a useful signal in a first frequency band;
generating a magnetic resonance signal in a second frequency band, wherein the first frequency band lies at least partially within the second frequency band;
receiving a reception signal by a receiving unit of the magnetic resonance apparatus, wherein the reception signal comprises the useful signal and the magnetic resonance signal; and
determining an item of evaluation information characterizing the useful signal from the reception signal, wherein the item of evaluation information comprises information regarding a movement of a patient.

2. The method of claim 1, wherein the first frequency band lies completely within the second frequency band.

3. The method of claim 1, further comprising:
generating a magnetic resonance signal in the first frequency band,
wherein the reception signal has an overlaying of the magnetic resonance signal in the first frequency band with the useful signal.

4. The method of claim 3, wherein the magnetic resonance signal is reconstructed from the reception signal based on the evaluation information.

5. The method of claim 4, wherein at least one magnetic resonance image is calculated from the reconstructed magnetic resonance signal.

6. The method of claim 1, wherein the generating of the useful signal comprises:
generating a useful excitation signal; and
changing the useful excitation signal into the useful signal by interaction with an examination object.

7. The method of claim 6, wherein the examination object is the patient.

8. The method of claim 6, wherein the useful excitation signal is used for determining the evaluation information.

9. The method of claim 8, wherein a portion of the useful excitation signal is decoupled by a coupler.

10. The method of claim 6, wherein the reception signal comprises a plurality of reception signal portions which are each received by a receiving channel, and
wherein the magnetic resonance signal is reconstructed for each receiving channel by subtraction of the useful excitation signal from a respective reception signal portion weighted with a respectively determined weighting factor.

11. The method of claim 1, wherein the receiving unit comprises a plurality of receiving channels, and
wherein, for each receiving channel, a weighting factor is determined as the evaluation information.

12. The method of claim 11, wherein the weighting factors are determined by reconstruction of the magnetic resonance signal from the reception signal.

13. The method of claim 11, further comprising:
determining a temporal change in at least one weighting factor, comparing the at least one weighting factor with at least one pre-determined reference value, comparing the at least one weighting factor of a receiving channel with at least one weighting factor of another receiving channel, or a combination thereof.

14. A magnetic resonance apparatus comprising:
a radio frequency transmitter configured to generate a useful signal in a first frequency band; and
a radio frequency transmitting coil configured to generate a magnetic resonance signal in a second frequency band, wherein the first frequency band lies at least partially within the second frequency band;

a receiving unit configured to receive a reception signal comprising both the useful signal and the magnetic resonance signal; and an evaluating unit configured to determine an item of evaluation information characterizing the useful signal from the reception signal, wherein the item of evaluation information comprises information regarding a movement of a patient.

15. The magnetic resonance apparatus of claim 14, wherein the first frequency band lies completely within the second frequency band.

16. A computer program product which comprises a program and is directly loadable into a memory store of a programmable system control unit of a magnetic resonance apparatus, wherein the program, when executed in a system control unit of the magnetic resonance apparatus, is configured to:

generate a useful signal in a first frequency band;

generate a magnetic resonance signal in a second frequency band, wherein the first frequency band lies at least partially within the second frequency band;

receive a reception signal comprising both the useful signal and the magnetic resonance signal; and determine an item of evaluation information characterizing the useful signal from the reception signal, wherein the item of evaluation information comprises information regarding a movement of a patient.

17. The computer program product of claim 16, wherein the first frequency band lies completely within the second frequency band.

* * * * *